United States Patent
Mokkapati et al.

(10) Patent No.: US 11,865,824 B2
(45) Date of Patent: Jan. 9, 2024

(54) METHOD AND DEVICE FOR TRANSFERRING A TRANSFER LAYER

(71) Applicant: EV Group E. Thallner GmbH, St. Florian am Inn (AT)

(72) Inventors: Venkata Raghavendra Subrahmanya Sarma Mokkapati, St. Florian am Inn (IN); Boris Povazay, St. Florian am Inn (AT); Thomas Uhrmann, St. Florian am Inn (DE)

(73) Assignee: EV Group E. Thallner GmbH, St. Florian am Inn (AT)

( * ) Notice: Subject to any disclaimer, the term of this patent is extended or adjusted under 35 U.S.C. 154(b) by 0 days.

(21) Appl. No.: 17/919,771

(22) PCT Filed: Apr. 20, 2020

(86) PCT No.: PCT/EP2020/061026
§ 371 (c)(1),
(2) Date: Oct. 19, 2022

(87) PCT Pub. No.: WO2021/213624
PCT Pub. Date: Oct. 28, 2021

(65) Prior Publication Data
US 2023/0211592 A1 Jul. 6, 2023

(51) Int. Cl.
B32B 37/00 (2006.01)
C23C 14/00 (2006.01)
C23C 14/06 (2006.01)
C23C 16/01 (2006.01)
C23C 16/26 (2006.01)

(52) U.S. Cl.
CPC ........ *B32B 37/025* (2013.01); *C23C 14/0005* (2013.01); *C23C 14/0605* (2013.01); *C23C 16/01* (2013.01); *C23C 16/26* (2013.01)

(58) Field of Classification Search
CPC .............. B32B 2307/20; B32B 37/025; C23C 14/0005; C23C 14/0605; C23C 16/01; C23C 16/26
See application file for complete search history.

(56) References Cited

U.S. PATENT DOCUMENTS

| 5,941,566 | A | * | 8/1999 | Holzapfel | B60R 22/205 280/801.2 |
|---|---|---|---|---|---|
| 7,144,603 | B2 | | 12/2006 | Nageli et al. | |
| 9,418,839 | B2 | * | 8/2016 | Zaretski | C23C 16/06 |
| 10,340,161 | B2 | | 7/2019 | Lindner | |
| 10,438,822 | B2 | | 10/2019 | Lindner | |

(Continued)

FOREIGN PATENT DOCUMENTS

| EP | 1 407 831 A2 | 4/2004 |
|---|---|---|
| WO | WO-2014/108505 A1 | 7/2014 |

(Continued)

OTHER PUBLICATIONS

English translation of WO2021/164855.*

(Continued)

*Primary Examiner* — Sonya M Sengupta
(74) *Attorney, Agent, or Firm* — KUSNER & JAFFE

(57) ABSTRACT

The invention relates to a device for the transfer of a transfer layer from a substrate, in particular from a growth substrate, to a carrier substrate.

20 Claims, 1 Drawing Sheet

(56) References Cited

U.S. PATENT DOCUMENTS

| | | | |
|---|---|---|---|
| 10,625,915 B2* | 4/2020 | Smith | B65D 75/30 |
| 11,328,939 B2 | 5/2022 | Lindner | |
| 11,565,837 B2* | 1/2023 | Colson | B29D 99/001 |
| 11,569,091 B2* | 1/2023 | Lutgen | G02B 26/0833 |
| 2004/0034556 A1* | 2/2004 | Matheson | B61L 27/14 |
| | | | 705/7.24 |
| 2004/0067305 A1* | 4/2004 | Nageli | B32B 33/00 |
| | | | 427/180 |
| 2006/0155570 A1* | 7/2006 | Almeida | G06Q 30/04 |
| | | | 705/1.1 |
| 2008/0154290 A1* | 6/2008 | Golden | A61B 17/11 |
| | | | 606/153 |
| 2015/0371848 A1* | 12/2015 | Zaretski | C25D 5/54 |
| | | | 438/496 |
| 2017/0119428 A1* | 5/2017 | Boyle | A61M 25/09 |
| 2017/0345690 A1* | 11/2017 | Lindner | H01L 21/67092 |
| 2018/0022079 A1* | 1/2018 | Burggraf | B32B 43/006 |
| | | | 156/712 |
| 2019/0198362 A1 | 6/2019 | Lindner | |
| 2019/0385870 A1 | 12/2019 | Lindner | |
| 2023/0211592 A1* | 7/2023 | Mokkapati | C23C 16/26 |
| | | | 156/230 |

FOREIGN PATENT DOCUMENTS

| | | |
|---|---|---|
| WO | WO-2016/101992 A1 | 6/2016 |
| WO | WO-2016/112975 A1 | 7/2016 |

OTHER PUBLICATIONS

Translation of opinion of PCT/EP2020/061026.*
International Search Report from corresponding International Patent Application No. PCT/EP2020/061026 dated Jan. 22, 2021.
Written Opinion from corresponding International Patent Application No. PCT/EP2020/061026 dated Jan. 22, 2021.

* cited by examiner

METHOD AND DEVICE FOR TRANSFERRING A TRANSFER LAYER

FIELD OF THE INVENTION

The invention describes a method for transferring a transfer layer.

BACKGROUND OF THE INVENTION

Layer transfer processes already exist in the prior art. These processes are used to transfer very thin transfer layers, in particular those with thicknesses in the micrometre or even nanometre range, from one substrate onto another substrate. Very many of these transfer layers can only be produced on a specific first surface, which however is not at the same time intended to be part of the subsequent functional component. The transfer layer thus has to be transferred from the first surface on to a second surface.

One of the most widely known layer transfer processes in the semiconductor industry is the SmartCut™ process. In this process, ions, in particular hydrogen ions, are fired into a first, oxidised monocrystalline substrate. The penetration depth of the hydrogen ions can be controlled by the kinetic energy and typically amounts to less than 2 μm. The hydrogen ions remain in the first substrate until the substrate has been bonded to a second substrate. A thermal process then ensures that the hydrogen atoms combine to form water molecules and aseparation of the first, oxidised, monocrystalline substrate takes place along the surface in which the hydrogen ions have collected. A triple layer structure is obtained, in which the oxide is enclosed between two other materials, usually silicon.

Attempts have been made in the industry for several years to produce graphene on large areas. There are a number of methods for producing graphene in the prior art. Graphene flakes can already be produced industrially by the ton. These graphene flakes are however of secondary importance for the semiconductor industry, since they are far too small and mainly arise through wet-chemical processes, in particular in solution, and not on substrate surfaces. It is desired to produce a graphene layer either at the wafer level, i.e. over the entire area of a wafer, or in a targeted manner at an already existing topology of a wafer. The production of a graphene layer at wafer level, however, appears to be the most promising.

SUMMARY OF THE INVENTION

It is an aim of the present invention, therefore, to overcome the drawbacks of the prior art and to provide an improved method and/or an improved device for the transfer of a transfer layer. In particular, it is the problem of the present invention to ensure that the transfer layer is not destroyed or damaged, in particular not due to high-energy ions.

The present invention is achieved with the features of the coordinated claims. Advantageous developments of the invention are specified in the sub-claims. All combinations of at least two features specified in the description, in the claims and/or the drawings also fall within the scope of the invention. In the stated value ranges, values lying within the stated limits should also be deemed to be disclosed as limiting values and can be claimed in any combination.

Described herein is a method for the transfer of a transfer layer, in particular a graphene layer, from one substrate, in particular from a growth substrate, to a carrier substrate, wherein the transfer takes place by means of an electromagnetic force.

Described herein is also a device for the transfer of a transfer layer, in particular a graphene layer, from one substrate, in particular from a growth substrate, to a carrier substrate, wherein the transfer layer can be transferred by means of an electromagnetic force.

The electromagnetic force is preferably an electrostatic force, which acts between ions in the carrier substrate and the transfer layer, in particular the graphene layer correspondingly charged with opposite polarity. The ions are preferably positively charged in the carrier layer and the transfer layer is charged negatively.

Provision is preferably made such that
- the transfer layer and/or the substrate is charged with first ions,
- the carrier substrate is charged with second ions, wherein the second ions are charged oppositely to the first ions,
- the force arises between the transfer layer and/or the substrate and the carrier substrate on account of the differently charged first and second ions.

Preferably, provision is also made such that the carrier substrate comprises a film, wherein the film is stretched in a frame and wherein the film receives the transfer layer.

The transfer layer preferably comprises a graphene layer.

The device preferably comprises a chamber, wherein a substrate holder is arranged in the chamber, wherein the substrate holder produces an electrically conductive connection to the substrate, in particular to the growth substrate.

In the following text, the transfer layer, in particular the graphene layer, is understood to mean the layer on the substrate, in particular the growth substrate, which is to be transferred onto the carrier substrate. The transfer layer has in particular been grown on the growth substrate.

The roughness of the surface of the growth substrate should preferably be as little as possible, in order to enable the production of the transfer layer. Particularly thin transfer layers, in particular graphene layers, are grown on very flat, clean surfaces.

The roughness is given either as a mean roughness, a quadratic roughness or as an averaged roughness depth. The ascertained values for the mean roughness, the quadratic roughness and the averaged roughness depth generally differ for the same measurement section or measurement area, but generally lie in the same order of magnitude range. Consequently, the following numerical value ranges for the roughness are to be understood either as values for the mean roughness, the quadratic roughness or for the averaged roughness depth.

The roughness of the surface of the substrate, in particular of the growth substrate, is preferably less than 100 μm, preferably less than 10 μm, still more preferably less than 1 μm, most preferably less than 100 nm, with utmost preference less than 10 nm.

The surface of the substrate, in particular of the growth substrate, is preferably monocrystalline.

In a preferred embodiment according to the invention, the substrate, in particular the growth substrate, comprises a first material, which is coated with a second material for the growth of the transfer layer. This second material is also referred to as a growth layer. The substrate, in particular the growth substrate, is in this case a composite made of the first material and the growth layer deposited thereon.

The desired materials for the growth substrate are very often not available as monocrystals or are difficult to grow or cannot be grown at all as solid monocrystals. In a case like this, it is advantageous if the necessary materials can be grown with the aid of thin-layer technology as monocrystalline thin layers.

In a still more preferred embodiment according to the invention, the entire growth substrate is a monocrystal.

In an alternative embodiment according to the invention, at least the surface of the growth substrate is recrystallised before the growth of the transfer layer, insofar as the surface is polycrystalline. The recrystallisation leads in most cases to a coarsening of the grain structure, but probably not to a monocrystal and is therefore a less preferred method according to the invention.

Provision is also preferably made such that
the transfer layer is contacted by the carrier substrate, and
wherein the ions in the carrier substrate are concentrated close to the transfer layer, so that the transfer layer is detached from the substrate, in particular the growth substrate, and adheres to the carrier substrate.

The method for the transfer of the transfer layer thus advantageously permits a straightforward and efficient transfer of the transfer layer from the surface of the substrate to the surface of the carrier substrate, in particular the transfer from a production surface onto a transport surface. The detachment is enabled by the action of ions, in particular hydrogen ions, in that the adhesion between the growth layer and the transfer layer is reduced, since the ions exert an attractive force on the transfer layer.

The carrier substrate is preferably contacted by the transfer layer, so that a relative movement between the contacted surfaces is advantageously no longer possible. Before a contact is made, the transfer layer and the carrier substrate are aligned with one another, in particular by an alignment of respective substrate holders. For the alignment, use is made in particular of alignment marks, which are applied on the substrate and/or the transfer layer and/or the carrier substrate, for an alignment that is as exact as possible.

Consequently, the transfer of the transfer layer onto the carrier substrate is advantageously enabled in a straightforward and efficient manner. Particularly advantageously, the transfer layer is not damaged or destroyed by the action of the ions. The generation or growth of the transfer layer has preferably been carried out beforehand on the growth substrate. The transfer layer can thus advantageously be detached from the place of its generation or its growth on the growth substrate and can be arranged on the carrier substrate.

In a particularly preferred embodiment, provision is made such that the transfer layer comprises a graphene layer. The graphene layer has preferably been produced, in particular deposited, on the growth layer.

Growth Substrate

A growth substrate is understood to mean a substrate on which the transfer layer is generated or grown. The growth substrate can be made of a single material. The use of a copper or nickel plate as a growth substrate would for example be conceivable.

In another embodiment according to the invention, the growth substrate is a substrate made of a first material, on which a layer of a second material has been produced. This layer can be referred to as a growth layer. The use of silicon, glass or sapphire wafers would for example be conceivable, on which a copper layer has been vapour deposited. Copper layers produced in this way can be, in particular, monocrystalline. Very often, therefore, it is simpler to use an arbitrary substrate as a growth substrate, which is then coated with a monocrystalline growth layer.

At least the surface of the growth substrate on which the transfer layer is grown should be monocrystalline. The growth substrate is thus preferably produced as already being monocrystalline. If the surface is not monocrystalline, it is brought at least as close as possible to the monocrystalline state preferably with the aid of suitable methods, preferably with recrystallisation.

In this disclosure, the terms growth layer and growth substrate are used synonymously. In particular, the expression growth substrate is usually used.

The material of the growth substrate is in principle not limited, but is guided by the transfer layer to be grown. Not every kind of transfer layer can be grown on every material of a growth substrate. A growth substrate can in principle thus be a conductor, a dielectric, a semiconductor or a superconductor.

Transfer Layer

The transfer layer can be made from a single material or a plurality of materials.

In particular, the transfer layer can be a series composite of different layers. In this disclosure, the series composite of layers is also referred to as a transfer layer.

In a particularly preferred embodiment according to the invention, the transfer layer is an atomic or molecular layer. This layer is also referred to as a 2D layer or 2D structure.

In a very particularly preferred embodiment according to the invention, the transfer layer is a graphene layer.

The method according to the invention can be applied to any kind of transfer layer. The transfer layer, however, is preferably a very thin layer. The thickness of the transfer layer is less than 1 mm, preferably less than 1 μm, still more preferably less than 100 nm, most preferably less than 1 nm, with utmost preference it is a monoatomic or monomolecular layer.

The transfer layer is preferably made from one of the following material classes or materials.

2D layer material, in particular
    Graphene
    Graphyne
    borophene
    germanene
    silicene
    $Si_2BN$
    gallenene
    stanene
    plumbene
    phosphorene
    antimonene
    bismuthene
2D supracrystals
compounds
    graphane
    boronitrene
    borocarbonitride
    germanane
    germanium phosphide
    transition metal dichalcogenide
    MXenes
layer materials with different element composition, in particular
    $MoS_2$, $WS_2$, $MoSe_2$, hBN, $Ti_4N_3$, $Ti_4AlN_3$
Van der Waals hetereo-structures, in particular
    $MoS_2$-G, $MoS_2$-hBN, $MoS_2$-hBN-G
metal, in particular
    Cu, Ag, Au, Al, Fe, Ni, Co, Pt, W, Cr, Pb, Ti, Ta, Zn, Sn·semiconductors, in particular
    Ge, Si, Alpha-Sn, B. Se, Te, compound semiconductors, in particular
  GaAs, GaN, InP, InxGa1-xN, InSb, InAs, GaSb, AlN, InN, GaP, BeTe, ZnO, CuInGaSe2, ZnS, ZnSe, ZnTe, CdS, CdSe, CdTe, Hg(1-x)Cd(x)Te. BeSe, HgS, AlxGa1-xAs, GaS, GaSe, GaTe, InS, InSe, InTe, CuInSe2, CuInS2, CuInGaS2, SiC, SiGe
ceramic
polymer
further materials
  $MnO_2$
  $TBA_xH_{(1.07-x)}Ti_{1.73}O_4 * H2O$
  $CoO_2$
  $TBA_xH_{(1-x)}Ca_2Nb_3O_{10}$
  $Bi_2SrTa_2O_9$
  $Cs_4W_{11}O_{36}^{2-}$
  $Ni(OH)_{5/3}DS_{1/3}$
  $Eu(OH)_{2.5}(DS)_{0.5}$
  $Co_{2/3}Fe_{1/3}(OH)_2^{1/3+}$
  $[Cu_2Br(IN_2)]_n]$ Carrier Substrate The carrier substrate can be made of any material which permits a passage of ions, in particular hydrogen ions. The material of the carrier substrate is preferably a polymer, in particular a polymer on a carbon base.

In a particular embodiment according to the invention, the carrier substrate is a composite component comprising a film and a frame, on which the film is clamped.

In another embodiment, the carrier substrate is a solid polymer substrate which is not supported.

According to the invention, a transport, in particular a diffusion, of the ions, preferably hydrogen ions, is especially promoted through a polymer. An electric field accelerates the ions and is also upright inside the polymer, even though weakened, since most polymers are dielectrics, which weaken electric fields by orientation and displacement polarisation, but do not completely eliminate them.

The carrier substrate is particularly well suited for being able to collect the ions in the vicinity of the transfer layer.

Device

The device according to the invention is preferably a chamber, in which the transfer layer on the substrate is brought into contact with the carrier substrate. The device is preferably a bonder.

The device preferably comprises at least one means for the generation of ions. This means preferably generates electromagnetic radiation, very particularly preferably UV radiation. X-radiation and/or gamma radiation. A source of electromagnetic rays can be located either in the chamber or outside the chamber. If the source is located outside the chamber, the rays are irradiated via a glass window into the chamber.

The device preferably comprises at least one valve, in order to convey a gas or a gas mixture into the chamber and/or to evacuate the latter. The device preferably comprises at least one second valve or a pipe connection in order to remove, in particular to pump out, the gas or the gas mixture from the chamber.

In another embodiment preferred according to the invention, the ions can also be generated outside the chamber and introduced into the chamber. The use an ion cannon, which generates the ions, would also be conceivable.

The device preferably comprises at least one lower substrate holder, on which the substrate, in particular the growth substrate, can be fixed. The lower substrate holder comprises components, with the aid of which the substrate can be put at potential. The substrate holder itself is preferably produced from electrically conductive material.

If the substrate is a full-volume electrically conductive substrate, for example a copper plate, the contact with the substrate holder is sufficient to put the substrate at potential via the conductive substrate holder. A substrate holder would also be conceivable which for example comprises, in particular mobile, contacting elements, which can be put at potential. These contacting elements can then make contact with the substrate and put it at potential. The substrate holder is preferably electrically insulated from the chamber by dielectric components.

In particular, the device comprises an insulation, with the aid of which the periphery of the substrate can be electrically insulated from the surroundings, in order to prevent the generated ions from reaching and penetrating the substrate laterally.

An electrode is preferably present in the device, which in particular lies opposite the substrate holder. Since the substrate holder is preferably located at the underside of the chamber, the electrode is preferably located at the upper side. The substrate holder and the electrode can be put at different potentials and build up an electric voltage between them. The build-up of the voltage leads to the formation of an electric field according to the invention, which accelerates the ions generated in the chamber in the direction of the substrate holder, or assists them during the passage through the substrate holder.

It is also conceivable for the use of a separate electrode to be dispensed with, and the chamber or the wall of the chamber is put at potential and thus acts as an electrode.

The device comprises a voltage source, with the aid of which the electric field can be generated. The voltage lies between 0 V and 10,000 volts, preferably between 0 V and 1000 V, most preferably between 0 V and 500 V, with utmost preference between 0 V and 100 V.

In particular, the chamber can be heated. The temperature can serve to control the ionisation of the gas or the gas mixture. The temperature lies in particular between 20° C. and 1000° C., preferably between 20° C. and 500° C., still more preferably between 20° C. and 250° C., most preferably between 20° C. and 200° C., with utmost preference around 130° C.

Method

In the method according to the invention, the used gas can preferably be ionised to form cations, i.e. positively charged particles. Accordingly, the substrate holder and/or the substrate, in particular the growth substrate, and/or the transfer layer are negatively charged. If use is made of anions, i.e. negatively charged ions, the polarity of the substrate holder and/or the substrate and/or the transfer layer is correspondingly positive.

Cations, i.e. positively charged ions, chiefly arise as a result of the mentioned ionisation process by means of UV radiation, so that the first case is used throughout in the description.

In a first process step of an illustrative method according to the invention, the substrate is made available as a growth substrate, which comprises a growth layer. The growth substrate is preferably the entire growth layer. The use of a copper plate, for example, is conceivable. It is also conceivable for the growth substrate to consist of a standard substrate, which has been coated with a material which serves as a growth layer.

For example, a silicone substrate, preferably epitaxial and monocrystalline, could be coated with copper.

In a second process step, a transfer layer is generated on the growth layer. The transfer layer is preferably produced by a CVD or PVD process.

In a third process step, the growth layer with the transfer layer located thereon is loaded into a chamber of the device according to the invention.

In a fourth process step, the growth layer is contacted, in particular bonded, with the surface of the carrier substrate. The bonding process can be preceded by an alignment procedure. The alignment procedure can be a mechanical alignment of the carrier substrate in relation to the substrate, which is carried out very approximately.

In a fifth process step, a gas or a gas mixture, preferably hydrogen, is introduced into the chamber.

In a sixth process step the gas or at least one component of the gas mixture is ionised. The ionisation preferably takes place with the aid of electromagnetic radiation, preferably with UV radiation. The radiation source is located either inside the chamber and/or outside. If the radiation source is located outside the chamber, the radiation passes through a window into the chamber.

In a seventh process step, a potential difference is produced between the growth layer and an electrode, in particular the housing of the chamber. The potential difference leads to an electric field, which accelerates the positive ions in the direction of the negatively charged growth substrate.

In a preferred embodiment according to the invention, the sixth and the seventh process steps take place at least partially simultaneously.

The ions first strike the carrier substrate and are decelerated by the latter. The ions are then driven by the electric field through the carrier substrate and reach the also negatively charged transfer layer. The ions collect in the carrier substrate in the vicinity of the transfer layer. Since the transfer layer is negatively charged, an attraction acts between the carrier substrate, positively charged by the positive ions, and the transfer layer. In particular, an insulation at the periphery of the growth substrate prevents the positive ions from being able to penetrate into the growth substrate.

The force with which the transfer layer is peeled off the substrate, in particular the growth substrate, is adjusted by the gas pressure and/or the electric field. To bring about a detachment, an amount of energy per unit area, the surface energy density, has to be overcome. The surface energy density preferably lies between 0.01 J/m2 and 1000 J/m2, more preferably between 1 J/m2 and 800 J/m2, most preferably between 1 J/m2 and 500 J/m2, with utmost preference between 1 J/m2 and 100 J/m2.

The temperature at which the transfer layer is preferably transferred lies in particular between 20° C. and 300° C. preferably between 50° C. and 250° C., still more preferably between 75° C. and 200° C., most preferably between 100° C. and 150° C., with utmost preference around 130° C.

A higher gas pressure means a higher ion density. By means of the electric field, it is possible to control how quickly the ions arrive at the transfer layer. The gas pressure lies between 0 mPa and 100 mPa, preferably between 0 mPa and 50 mPa, still more preferably between 0 mPa and 25 mPa, most preferably between 0 mPa and 10 mPa, with the utmost preference around 1.5 mPa.

In a particularly preferred design of the method, the gas pressure lies between 0.1 mbar and 10 mbar, preferably between 0.2 mbar and 7 mbar, particularly preferably between 0.25 mbar and 5 mbar, most preferably around 0.3 mbar.

In an eight process step, the carrier substrate together with the transferred transfer layer is separated from the growth substrate. The separation process preferably takes place in steps from at least one the edge by peeling. However, it is also conceivable for the carrier substrate to be lifted off over the whole area with the transfer layer from the growth substrate.

It is conceivable that the ions move away via the transfer layer in the direction of the growth substrate and become reduced there (positive ions). Particularly in the case of hydrogen, the effect of this is that hydrogen gas is formed, which has a much larger volume. The formation of hydrogen gas at the interface between the growth substrate and the transfer layer can have a favourable effect on the detachment of the transfer layer from the growth substrate and can promote the latter. The formation of hydrogen gas leads to a mechanical stress, which can very markedly reduce the adhesion of the interface between the growth substrate and the transfer layer. This effect is therefore to be considered in combination with the aforementioned effect of the ion accumulation in the carrier substrate. Whether this effect and to what extent this effect improves the first effect according to the invention depends on the corresponding parameters.

BRIEF DESCRIPTION OF THE DRAWINGS

Further advantages, features and details of the invention emerge from the following description of preferred examples of embodiment and with the aid of the drawings. In the figures.

DETAILED DESCRIPTION OF THE INVENTION

Identical components and components with the same function are denoted by the same reference numbers in the figures.

The figures are not true to scale. In particular, a transfer layer 12 is represented much thicker than it should be in relation to a growth substrate 13 or to a carrier substrate 10. The representation not true to scale is used merely for the purpose of clarity.

Figure 1:
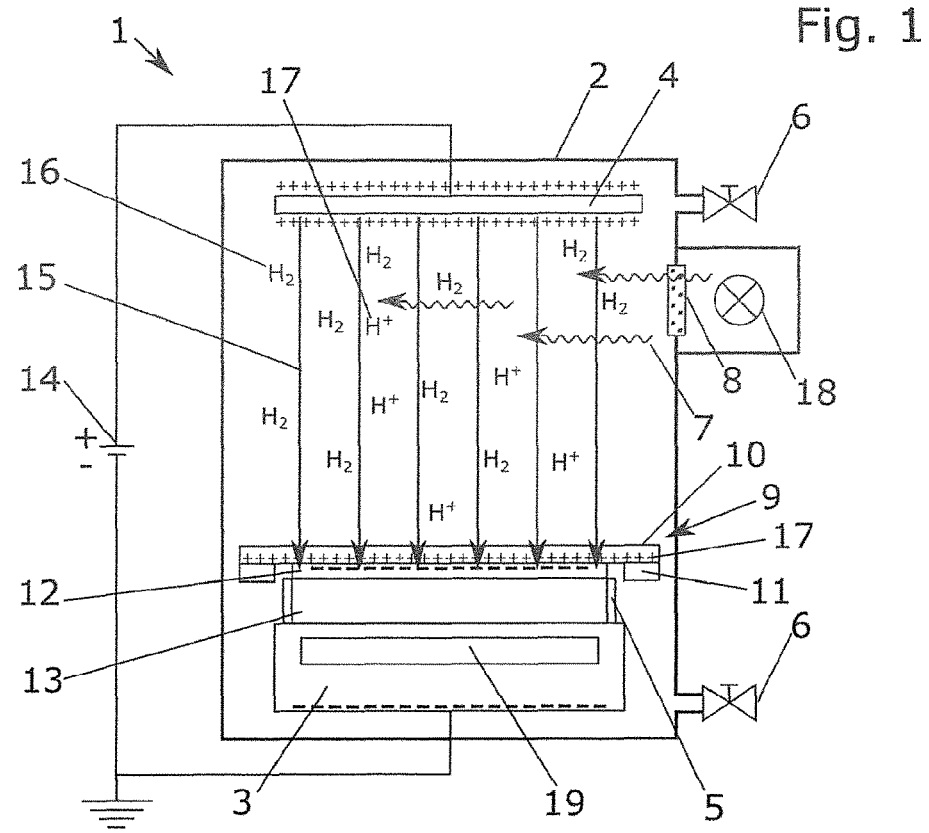
FIG. 1 shows an illustrative embodiment of a device according to the invention.

FIG. 1 shows a device 1 according to the invention, comprising a chamber 2, in which a substrate holder 3 is located. Substrate holder 3 is electrically conductive and has at least one electrically conductive connection to growth substrate 13. Chamber 2 comprises at least one valve 6, via which a gas or a gas mixture 16 can be introduced.

Preferably, there is also a second valve 6, via which gas or gas mixture 16 can be discharged. Chamber 2 comprises an electrode 4. It is also conceivable for a wall of chamber 2 to serve as electrode 4. For the sake of clarity, electrode 4 is represented as a separate component.

Device 1 comprises a radiation source 18, with the aid of which the components of gas or gas mixture 16 can be ionised to form ions 17. Radiation source 18 can be located inside or outside chamber 2. If radiation source 18 is located outside chamber 2, a window 8 enables passage of radiation 7 into chamber 2.

Transfer layer 12 is generated on growth substrate 13, in particular by a CVD or PVD process. Growth substrate 13 is fixed on substrate holder 3. Growth substrate 3 is preferably shielded from the surroundings by insulation 5.

Transfer layer 12 is contacted from the other side by carrier substrate 9. In the present case, carrier substrate 9 is a film 10, which is stretched in a frame 11. Carrier substrate 9 can however be designed arbitrarily, as long as it permits the passage of ions 17 to transfer layer 12 or as long as ions 17 collect in carrier substrate 9 (in the present case, in film 10). Ions 17 are now represented by their charge, since the use of the symbol would complicate the drawing and make it more complex.

Ions 17 are accelerated by applied electric field 15 in the direction of transfer layer 12 and first strike carrier substrate 9. Electric field 15 penetrates the entire, in particular dielectric, carrier substrate 9 completely up to growth substrate 13. Ions 17 are thus also still accelerated in carrier substrate 9, but have to pave their way towards transfer layer 12 by diffusion processes.

Ions 17 collect in the carrier substrate in the vicinity of transfer layer 12. Since electric field 15 ends at the surface of growth substrate 13 (more precisely, at the surface of transfer layer 12, insofar as the latter is electric), no further driving force is present to convey ions 17 deeper into growth substrate 13.

Nonetheless, some ions 17 could succeed in penetrating up to growth substrate 13, in particular due to tunnel effects. Ions 17 could be reduced again there and combine in particular to form hydrogen gas. The hydrogen gas can expand and thus promote the separation of transfer layer 12 from the side of growth layer 13. In this case, device 1, but in particular substrate holder 3, has a heating device 18 in order to bring the substrates up to temperature.

Figure 2A:
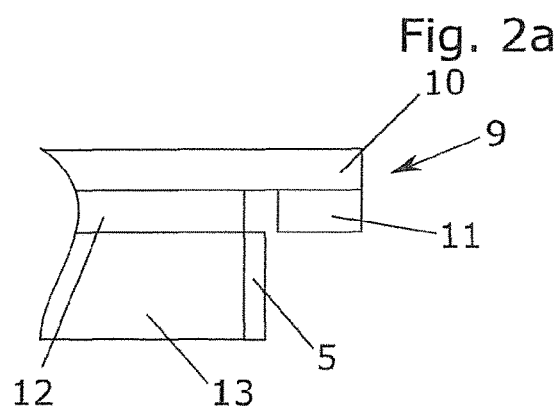
FIG. 2a shows a simplified, cross-sectional representation of the right-hand side of the device in a first process step of an illustrative method according to the invention.

FIG. 2a shows a representation of the right-hand side of the device in a first process step of an illustrative method according to the invention, wherein carrier substrate 9 contacts transfer layer 12, which is located on growth substrate 13.

Figure 2B:
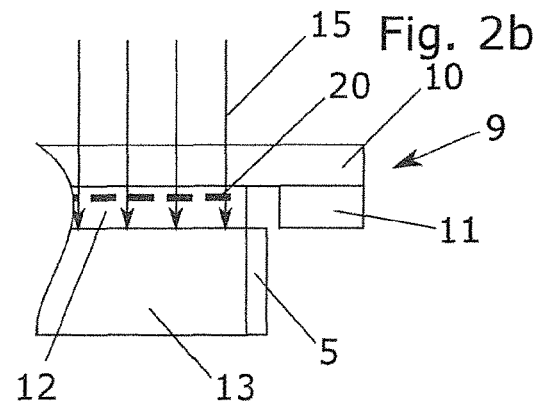
FIG. 2b shows a simplified, cross-sectional representation of the right-hand side of the device in a second process step.

FIG. 2b shows a second process step wherein an electric field 15 is applied, the effect of which is that transfer layer 12 becomes negatively charged. Negative charge carriers 20 migrate into the surface of transfer layer 12, insofar as transfer layer 12 is a conductor. If transfer layer 12 is a dielectric, negative charge carriers 20 are to be understood as being the negative charge carriers of a displacement or orientation polarisation. Actual negative charge carriers 20 would then be located either at the surface of growth layer 13, or, if the latter is also a dielectric, at the surface of the substrate holder (not shown). The corresponding positive charge carriers are not shown in this case. What is relevant is that the surface of transfer layer 12 is negatively charged.

Figure 2C:
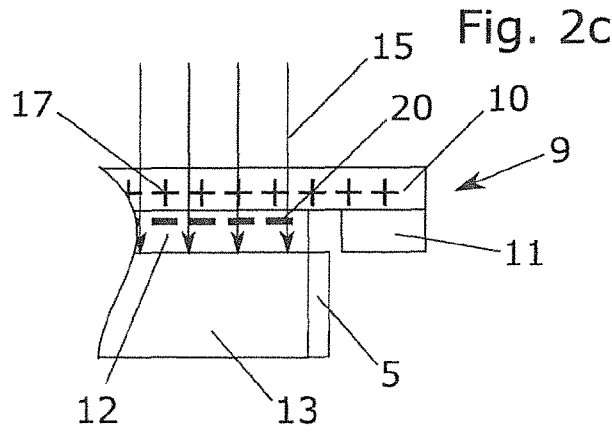
FIG. 2c shows a simplified, cross-sectional representation of the right-hand side of the device in a third process step

FIG. 2c shows a third process step, wherein the ions 17, in particular hydrogen ions, remain in carrier substrate 9 and have approached transfer layer 12. On account of the different sign between positively charged ions 17 and negatively charged transfer layer 12, an attraction prevails between the two.

Figure 2D:
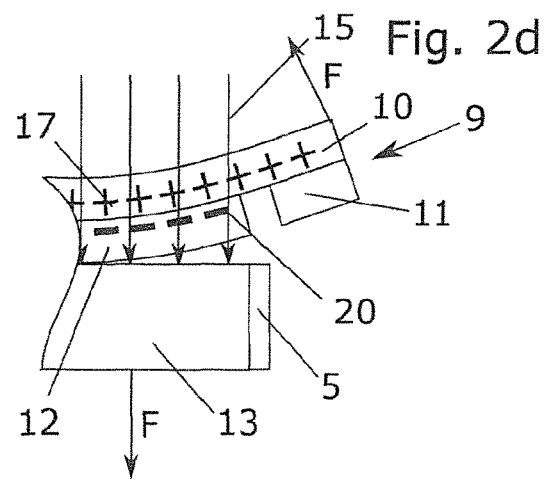
FIG. 2d shows a simplified, cross-sectional representation of the right-hand side of the device in a fourth process step.

FIG. 2d shows a fourth process step, wherein transfer layer 12, which adheres to carrier substrate 9 (in the special case to film 10), is removed from growth substrate 13 by a peeling process from the edge.

LIST OF REFERENCE NUMBERS

1 device
2 chamber
3 substrate holder/electrode
4 electrode
5 insulation
6 valve
7 radiation
8 window
9 carrier substrate
10 film
11 frame
12 transfer layer
13 growth substrate
14 voltage source
15 electrical field lines
16 gas
17 ion
18 radiation source
19 heating device
20 negative electrode charge
F force Having described the invention, the following is claimed:

1. A method for the transfer of a transfer layer from a growth substrate to a carrier substrate, the method comprising:
    charging the transfer layer and/or the growth substrate with charge carriers; and
    charging the carrier substrate with ions that are charged oppositely to the charge carriers of the transfer layer and/or the growth substrate,
    wherein an electromagnetic force (F) is generated between the transfer layer and/or the growth substrate and the carrier substrate due to the oppositely charged ions and the charge carriers.

2. The method according to claim 1, wherein the transfer layer is a graphene layer.

3. The method according to claim 1, wherein the carrier substrate includes a film,
    wherein the film is stretched in a frame, and
    wherein the film receives the transfer layer.

4. The method according to claim 1, wherein a roughness of a surface of the growth substrate is less than 100 µm.

5. The method according to claim 1, wherein a surface of the growth substrate is monocrystalline.

6. The method according to claim 1, wherein the growth substrate includes a first material that is coated with a second material for growth of the transfer layer.

7. The method according to claim 1, wherein the transfer layer is contacted by the carrier substrate, and
    wherein the ions charged in the carrier substrate are concentrated close to the transfer layer such that the transfer layer detaches from the growth substrate and adheres to the carrier substrate.

8. The method according to claim 1, wherein the electromagnetic force (F) lies between 0.01 J/m2 and 1000 J/m2.

9. A device for the transfer of a transfer layer from a growth substrate to a carrier substrate, the device comprising:
    a voltage source configured to generate an electric field for charging the transfer layer and/or growth substrate with charge carrier substrate with ions that are charged oppositely to the charge carriers of the transfer layer and/or the growth substrate,
    wherein an electromagnetic force (F) is generated between the transfer layer and/or the growth substrate and the carrier substrate due to the oppositely charged ions and the charge carriers.

10. The device according to claim 9, further comprising:
a chamber comprising a substrate holder arranged therein, the substrate holder being configured to produce an electrically conductive connection to the growth substrate.

11. The device according to claim 8, wherein the transfer layer is a graphene layer.

12. The device according to claim 8, wherein the carrier substrate includes a film,
wherein the film is stretched in a frame, and
wherein the film receives the transfer layer.

13. The device according to claim 9, wherein a surface of the growth substrate is monocrystalline.

14. The device according to claim 9, wherein the growth substrate includes a first material that is coated with a second material for growth of the transfer layer.

15. The method according to claim 4, wherein the roughness of the surface of the growth substrate is less than 10 μm.

16. The method according to claim 15, wherein the roughness of the surface of the growth substrate is less than 1 μm.

17. The method according to claim 16, wherein the roughness of the surface of the growth substrate is less than 100 nm.

18. The method according to claim 8, wherein the electromagnetic force (F) lies between 0.1 J/m2 and 800 J/m2.

19. The method according to claim 18, wherein the electromagnetic force (F) lies between 1 J/m2 and 500 J/m2.

20. The method according to claim 19, wherein the electromagnetic force (F) lies between 50 J/m2 and 100 J/m2.

* * * * *

UNITED STATES PATENT AND TRADEMARK OFFICE
CERTIFICATE OF CORRECTION

PATENT NO. : 11,865,824 B2
APPLICATION NO. : 17/919771
DATED : January 9, 2024
INVENTOR(S) : Mokkapati et al.

Page 1 of 1

It is certified that error appears in the above-identified patent and that said Letters Patent is hereby corrected as shown below:

In the Claims

Column 10, Claim 9, Lines 59-63 -- "a voltage source configured to generate an electric field for charging the transfer layer and/or growth substrate with charge carries substrate with ions that are charged oppositely to the charge carriers of the transfer layer and/o the growth substrate" should be corrected to read:
"a voltage source configured to generate an electric field for charging the transfer layer and/or growth substrate with charge carriers and charging the carrier substrate with ions that are charged oppositely to the charge carriers of the transfer layer and/or the growth substrate"

Signed and Sealed this
Fifteenth Day of April, 2025

Coke Morgan Stewart
*Acting Director of the United States Patent and Trademark Office*